United States Patent [19]

Eichelberger et al.

[11] Patent Number: 4,918,811
[45] Date of Patent: Apr. 24, 1990

[54] MULTICHIP INTEGRATED CIRCUIT PACKAGING METHOD

[75] Inventors: Charles W. Eichelberger, Schenectady; Robert J. Wojnarowski, Ballston Lake, both of N.Y.

[73] Assignee: General Electric Company, Schenectady, N.Y.

[21] Appl. No.: 391,398

[22] Filed: Aug. 8, 1989

Related U.S. Application Data

[60] Continuation of Ser. No. 215,187, Jul. 5, 1988, abandoned, Division of Ser. No. 912,456, Sep. 26, 1986, Pat. No. 4,783,695.

[51] Int. Cl.⁵ .............................................. H05K 3/34
[52] U.S. Cl. ........................................ 29/840; 437/209
[58] Field of Search ................. 29/840, 825, 832, 834; 174/68.5; 437/209

[56] References Cited

U.S. PATENT DOCUMENTS

| | | | |
|---|---|---|---|
| 3,501,832 | 3/1970 | Iwata et al. | 29/840 |
| 3,903,590 | 9/1975 | Yokogawa | 437/209 |
| 4,709,468 | 12/1987 | Wilson | 439/209 |

*Primary Examiner*—Carl J. Arbes
*Attorney, Agent, or Firm*—Marvin Snyder; James C. Davis, Jr.

[57] ABSTRACT

A multichip integrated circuit package comprises a substrate to which is affixed one or more integrated circuit chips having interconnection pads. A polymer film overlying and bridging integrated circuit chips present is provided with a plurality of via openings to accommodate a layer of interconnection metallization which serves to connect various chips and chip pads within the interconnection pads disposed on the chips. A significant advantage of the packaging method and configuration of the present invention is the ability for the polymer film to be removed. This significantly improves testability and effectively provides wafer scale integration circuit packages which are free of problems associated with yield and testability.

5 Claims, 2 Drawing Sheets

MULTICHIP INTEGRATED CIRCUIT PACKAGING METHOD

This application is a continuation of application Ser. No. 215,187, filed July 5, 1988, now abandoned, which in turn is a division of application Ser. No. 912,456, filed Sept. 26, 1986, now U.S. Pat. No. 4,783,695 issued Nov. 8, 1988.

BACKGROUND OF THE INVENTION

The present invention is generally directed to an integrated circuit packaging configuration exhibiting greatly increased packaging densities over that which is presently obtainable. More particularly, the present invention relates to a packaging method for electronic integrated circuit chips, particularly very large scale integrated circuit (VLSI) devices on a substrate also having a removable polymer film overlying the chips on the substrate and providing a means for supporting interchip and intrachip connection conductors. Even more particularly, the present invention relates to removable interchip and intrachip interconnection means which provide wafer scale integration packaging densities while at the same time, rendering it possible to reconfigure the system of chips by removing the polymer film and redepositing a second film layer with a different interconnection arrangement.

In the packaging of very large scale integrated circuit devices, a great deal of space is taken up by mechanisms for interconnecting one chip to an adjacent device. This makes the packaging of integrated circuit devices and electronic components based thereon larger than necessary. As a result of this, many individuals are involved in the development of so-called wafer scale integration processes. However, the efforts expended in these directions have generally tended to be limited by the problem of yield. Because a certain number of chips or dies on a wafer are often found to be defective, the number of wafers that are produced that are completely usable is generally lower than is desired. Furthermore, there still exists the problem of interconnecting the various chips on a wafer and the concomitant problem of testing a large system, such as results when a number of highly complicated individual integrated circuit components are interconnected. Accordingly, it is seen that it would be very desirable to construct wafer scale integrated circuit packages from individual, easily testable integrated circuit chips. It is to this end that the present invention is directed.

More particularly, the present invention is directed to a configuration and method employing a polymer film overlay. This film covers a plurality of integrated circuit chips adjacent to one another on an underlying substrate. Furthermore, the polymer film provides an insulative layer upon which is deposited a metallization pattern for interconnection of individual circuit chips. Furthermore, a significant advantage of the system of the present invention is the ability to remove one or more of these interconnection layers so as to provide a multitude of arrangement and testing capabilities.

One configuration of the present invention involves the disposition of a polymer film over a plurality of integrated circuit chips affixed to an underlying substrate. A method for carrying out such a process is described in application Ser. No. 240,367, filed Aug. 30, 1988 as a continuation of appplication Ser. No. 912,458, filed Sept. 26, 1986 now abandoned. An apparatus for carrying out a polymer overlay process, as preferred in the practice of the present invention, is also disclosed therein. In particular, the inventions disclosed therein solve significant problems with respect to high temperature processing and the requirement for excellent compliance of a plastic material to an irregular surface. Accordingly, aforementioned application Ser. No. 912,458 is hereby incorporated herein by reference.

Likewise, in the practice of the present invention, it is desirable to provide via openings or apertures in the polymer dielectric layer so as to be able to provide electrical connection between various parts of a chip or between several chips. Accordingly, U.S. Pat. No. 4,714,516, issued Dec. 22, 1989 discloses therein a preferred embodiment for carrying out a process for providing such apertures. Likewise, U.S. Pat. No. 4,714,516 is also hereby incorporated herein by reference. The above mentioned application and patent are assigned to the same assignee as the present invention.

In general, the problem solved by the present invention is that of interconnecting integrated circuit chips. In recent years, this problem has been compounded by the dramatic increase in the number of interconnects associated with VLSI circuitry. Since very large scale integrated circuits incorporate a large portion of the total system into one integrated circuit, more interconnects must be provided to the VLSI circuit.

At the same time, circuit complexity is increasing, reduced circuit dimensions are also desired and employed since they lead to higher speed devices. To promote speed, interconnection from one chip to another must be accomplished with a minimum of capacitive loading and a minimum of interconnect length. Capacitive loading tends to slow down signal transmission such that high speeds attained on the chip cannot be maintained in communicating from one chip to another. Interconnection length between chips also contributes to propagation delay due to greater capacitive loading effects in the dielectric medium due to circuit length and also due to a self inductance of the interconnection circuit.

Space, or "chip real estate", is another important consideration even in such devices as the personal computer. A simple calculation based on the amortized cost of each card slot in a regular personal computer indicates that the value of the card slot is approximately $400. Obviously, in portable equipment, size and weight are of primary importance. Even in large computer and super computer systems, size and signal speed are very significant.

In many applications, it is necessary to provide intimate contact between a semiconductor device and the substrate to which it is mounted. Intimate contact is highly desirable to assure the best electrical connection and also the best thermal conductivity for the purpose of heat removal. In those interconnection technologies, where chips are mounted upside down, elaborate structures must be provided for removal of heat or for making electrical connection to the substrate of the chip.

The reliability of an electronic system is only as great as the chain of reliabilities of each of the interconnects between the integrated circuit chip and the outside world. In a conventional system, an integrated circuit chip is placed in a package; then, wire bond or tape-automated bonding methods are used to make interconnections from the pads of the chip to the pins of the package. The pins of the package are then connected to the runs of a printed circuit board by soldering. To connect two integrated circuits together, the runs of the printed circuit board are subsequently soldered to the pins of a second package and the pins of the second package are bonded to the pads of the integrated circuit thereon. It can be seen that a multiplicity of interconnects have been required simply to connect one integrated circuit to another. For the reasons discussed above, this is not desirable.

Interconnection is often provided by several different methods. The first has already been mentioned above, where interconnection is provided by wire bonding from the pads of the chip to the pins of the package. Generally, this method is used to package only a single chip. Multiple chips have been interconnected in hybrid circuits in accordance with the following process. A substrate is processed either by thick or thin film methods to provide interconnect wiring on the substrate; chips are mounted on the substrate; and wire bonding is used to make connections from the pads of the integrated circuit chip to the wiring of the hybrid substrate. In this method, run-to-run spacing on the substrate is typically approximately 20 mils (10 mils for the conductor and 10 mils for the gap between the conductors). This leads to a pitch discrepancy between pads on the chip and the runs required to make interconnections between the chips. It is, therefore necessary that the chips be separated by relatively large distances to accommodate the intercomponent wiring. Ceramic multilayers with chips mounted by solder bump methods comprise another interconnection method. In this method, alternate layers of conductor and ceramic insulator are pressed together in the green state and fired to form a multilayer structure. Chips are provided with solder bumps on each pad and subsequently mounted upside down so that the solder bump positions on the chip correspond to interconnect areas on the ceramic multilayer. While this method has provided relatively high density interconnections, it has several limitations. Firstly, the chips must be specially processed in order to provide them with the solder bump. Secondly, the conductor areas are defined by screen printing methods, and the required vias are defined by mechanical punching methods. In general, these methods tend to suffer from reliability and repeatability problems. Thirdly, the green ceramic shrinks by approximately 20% during the firing process. All these factors contribute to a relatively low interconnect density on any given layer. In order to achieve high overall packing density, it is necessary to provide a large number of layers (10 to 20 such layers not being uncommon in a complex multilayer ceramic substrate). Heat removal is an additional problem since the solder bumps do not provide sufficient heat removal and some kind of elaborate mechanical connection usually must be made to the backs of the chip. Since a great deal of tooling is required, this method is not amenable to low-cost, low-volume production. Finally, an additional problem exists in that the size of the solder bump presently limits pad separation to approximately 10 mils.

In a process seeking to achieve some of the same objectives as the present invention, semiconductor chips are mounted on a substrate, and a layer of material such as polytetrafluoroethylene (PTFE) is pressed over the tops of the chips and around the chips so that the chips are completely encapsulated in this layer. Holes are etched in the encapsulating layer corresponding to pad positions on the chips. Metallization is applied and patterned to form interconnections. However, the present invention is significantly different from such processes for the following reasons. In this process, known as semiconductor thermodielectric processing, the chips are completely embedded in PTFE material so that no overlay layer as such exists. This makes it impossible to repair an assembly since the chips cannot be removed. Even if a chip could be removed, the remaining chips would still be encapsulated in the PTFE material and there would be no way to install a replacement chip and to interconnect that chip to the rest of the system. In addition, there is no provision in the semiconductor thermo-dielectric processing method for a removable metallization layer which is selectively etched, thus protecting the underlying circuit while assuring complete removal of the metallization layer. In addition, the semiconductor thermodielectric processing method faces two other problems. First, by encapsulating chips in a polymer, a high degree of stress is created by the difference in thermal expansion coefficients. Second, the thickness of the polymer over the top of the chips is governed solely by the thickness of the chip and the tooling which encapsulates the chips. Variations in chip thickness lead to variations in the thickness of the polymer over the chip.

An additional problem with ceramic multilayer configuration as well as with hybrid devices on ceramic substrate is the relative dielectric constant associated with ceramic materials which is approximately 6. This also leads to higher capacitive loading and increased propagation delay as compared with polymer dielectrics which possess a typical relative dielectric constant of between about 2 and about 4.

SUMMARY OF THE INVENTION

In accordance with a preferred embodiment of the present invention, a multichip integrated circuit package comprises a substrate and a plurality of integrated circuit chips disposed on the substrate. The chips include interconnection pads for connecting to other integrated circuit components or for connecting to other parts of the same chip. A polymer film overlies and bridges the integrated circuit chips on the substrate and is provided with a plurality of via openings aligned with at least some of the interconnection pads. A pattern of interconnection conductors is disposed on the overlying film so as to extend between at least some of the via openings and so as to provide electrical connection between the pads. A variety of substrate materials may be employed including glass, ceramics, metals, plastics and composites. An important aspect of the present invention is that the polymer film is removable and may also comprise a large number of different polymeric materials.

In a method for integrated circuit packaging in accordance with the present invention, a plurality of circuit chips is disposed on a substrate. A polymer film is applied over the chips and the substrate so that the film bridges the chips. A plurality of via openings is provided in the film so as to expose at least some interconnection pads on the chips. Then, a pattern of electrical conductors is provided on the film so that the conductors extend between select via openings so as to electrically connect selected interconnection pads.

Accordingly, an object of the present invention is to provide a direct interconnection between integrated circuit chips, said interconnection being highly reliable and requiring the least number of interconnections.

Another object of the present invention is to provide an overlay layer which can be removed and reapplied so that repair of the assembly is achieved without degrading remaining chip parts which have been tested and found not to be defective.

Yet another object of the present invention is to provide a method of directly interconnecting integrated circuit chips and other electronic components.

A further object of the present invention is to provide an interconnect method with very high speed capability due to the minimum capacitance of the interconnect, the minimum length of the interconnect and the use of a polymer dielectric.

A still further object of the present invention is to provide an interconnect method which allows simple attachment of the integrated circuit chip to the substrate for the purpose of heat removal and electrical connection, while accommodating chips of varying thicknesses.

Yet a further object of the present invention is to provide an interconnect which reduces the overall system size such that the area of the total electronic system is not substantially larger than the area of the individually incorporated electronic circuit components.

A still further object of the present invention is to provide an interconnect system with built-in flexibility of the interconnection mechanism so as to accommodate thermal expansion and thermal mismatch between system components.

Lastly, but not limited hereto, an object of the present invention is to provide an interconnection method wherein the interconnection pads of an integrated circuit chip can be reduced in size below the size presently dictated by techniques of solder bump and flying lead bonding.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
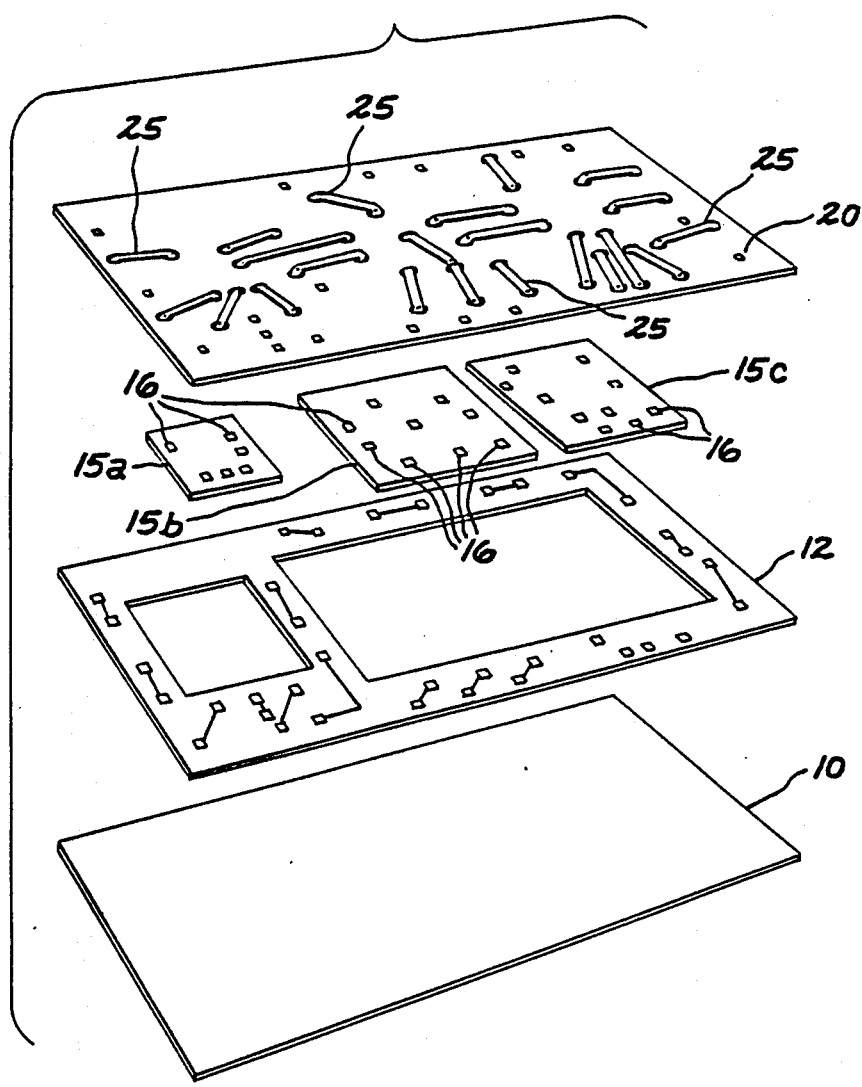
FIG. 1 is an exploded, isometric view providing a partially schematic representation of the packaging configuration and method of the present invention.

FIG. 1 illustrates an exploded view of one embodiment of the present invention. In this view, there are three distinct layers shown in exploded fashion: a substrate layer 10, a packaging layer and overlay layer 20. The packaging layer includes optional packing insert 12 having apertures into which chips 15a, 15b and 15c are placed. It is noted that the number and arrangement of integrated circuit chips shown in FIG. 1 is solely for the purpose of illustration. Likewise, the placement of interconnect pads 16 on the chips and the placement of interconnect metallization patterns 25 on layer 20 is likewise merely exemplary. There may be more chips or fewer chips configured in numerous arrangements and interconnected in numerous different fashions, as determined by conductive patterns on overlay layer 20 and packaging insert 12 and most importantly by the desired function of the chip system. It is also noted that packaging insert 12 is preferred, but is optional.

Substrate 10 may comprise a number of different materials. For example, a substrate of alumina is possible. Substrate 10 may also include a metal such as copper, for the purpose of maximum heat removal, or maximum electrical conductivity. Other examples of substrate materials include ceramic multilayer circuits or even silicon which can provide good thermal conductivity and virtually an identical thermal coefficient of expansion with respect to silicon especially when integrated circuit chips 15a, 15b and 15c are silicon based. It is also noted that the chips do not necessarily have to comprise silicon based semiconductor devices, but may also include gallium arsenide or other type devices. Moreover, the same circuit technologies do not have to be employed on all chips. Chip technology types may be mixed and matched as appropriate. Substrate layer 10 may also comprise glass, plastic materials and, if necessary, composites. The most important property of substrate layer 10 is that its coefficient of thermal expansion be approximately equal to the coefficient of thermal expansion of other materials employed in the assembly.

The second layer shown in FIG. 1 is the optional packaging layer which includes packing insert 12. Packaging insert 12 may be employed to provide interconnections between the chips and the pins of the package as well as to provide connection for power and ground, if necessary. This layer can be fabricated by a number of different means. In basic systems where no additional interconnect capability is required, this layer simply comprises a punched lamination with no included interconnect metallization. Alternatively, packing insert 12 can be fabricated using thick film methods in which a layer of dielectric is printed and fired, followed by subsequent layers of conductor or dielectric. A third alternative is to fabricate this layer as part of a multilayer ceramic circuit in which the bottom of the ceramics bond to the substrate and the intermediate layers form packing insert 12.

Chips 15a–15c are mounted in place by any one of a number of methods for die attachment. Such methods include eutectic die bonding, epoxy die bonding and thermoplastic die bonding. In eutectic die bonding, a gold germanium solder preform is placed under each chip and the substrate is subsequently heated to the eutectic melting point of the gold germanium preform. A silicon-gold solder eutectic is formed. A second alternative involves the use of a thermosetting epoxy which can either be loaded with silver or with gold to achieve electrical conductivity, or filled with alumina or beryllia to achieve thermal conductivity. Epoxy is applied by screen printing methods or by dispensing from a needle tip. The chips are placed on the epoxy with the substrate subsequently being heated for a period of typically about 30 minutes to effect a complete cure of the epoxy. A third alternative involves applying a thermoplastic such as ULTEM ® resin (as sold by the General Electric Company) or silicon polyimide to the substrate using a solvent such as NMP (N-methyl pyrolidone). The chips are subsequently placed in the thermoplastic and again, heat is applied with an oven or hot plate until the thermoplastic melts and/or residual solvent is driven off. Upon cooling, the chips are thus bonded to the substrate. At this point a polymer overlayer is laminated over the tops of the chips. In a presently preferred embodiment, lamination is achieved by first spraying the chips and the packaging insert layer with a thin layer of ULTEM ® 1000 resin and a solvent of methylene chloride and acetophenone. This layer is then dried at a temperature of from approximately 200° C. to approximately 300° C. for a period of approximately 5 minutes and is used as a thermoplastic adhesive for bonding a 1 mil thick KAPTON ® film layer to the chip. KAPTON ® is a registered trademark of the Dupont de Nemours Company, Inc. Lamination may be achieved using conventional laminators and using a silicone rubber press pad to amortize the height differential. Alternatively, laminations can be achieved using the vacuum-pressure laminator as disclosed in the aforementioned application Ser. No. 240,367. The laminating temperature used is the temperature at which the thermoplastic adhesive melts. In the case of ULTEM ® resin, the temperature is between approximately 250° C. and 350° C.

Via holes are now formed in the structure resulting from the above process steps. Via holes are formed above those interconnect pads on the circuit chips where interconnection to power, ground, signal or packaging pins is desired. Via holes are formed by depositing a thin layer of metallization, such as for example, a 1,000 angstrom thick layer of titanium or chrome on the polymer surface. Via opening positions are then patterned in the layer using conventional photolithography methods. That is, a layer of photoresist is deposited, dried, and exposed through a mask and subsequently developed. For example, when titanium is used, it is etched with a solution of fluoroboric acid, and the titanium is then used as an etch mask in an oxygen-plasma reactive ion etching device. In this way, holes are etched in the polymer, but the oxygen plasma does not attack the metal pads of the integrated circuit chip or of packing insert 12.

Metallization is now preferably applied by first using a glow discharge to clean the surface of the chip pads and the surface of the packing insert layer. After cleaning, a buffer layer of metallization, such as titanium or chrome is applied to cover the entire surface of the overlay layer and to fill the via holes and to contact the top of the interconnection pads of the chip and the packing insert. The titanium or chrome metallization, which is optional, is deposited to a thickness of approximately 1,000 angstroms. These metallizations are used for four specific reasons. First, they form a buffer layer to prevent subsequently deposited copper metallization from migrating through the pads of the chip and causing spiking into the chip substrate. Second, titanium and chrome are relatively reactive metals and form stable chemical bonds between the polymer of overlay layer 20 and subsequently applied metallization. Third, titanium and chrome react with aluminum oxide to give good ohmic contact to the chip pads. Fourth, titanium and chrome are metals which are not attacked by etching solutions which attack copper which is a preferred metal for subsequent deposition. This allows the copper to be completely removed during an interconnection removal process which is described in more detail below.

Without removing the workpiece from the sputtering chamber, a deposit of copper is sputtered directly on the titanium or chrome deposit. Copper is used to provide a high degree of conductivity. Copper is deposited to a thickness of between approximately 2 and approximately 5 microns. After copper deposition, the substrate is removed from the sputtering chamber and a layer of photoresist is deposited on the surface of the copper either by spraying or spinning methods. The resist is then exposed using a contact mask according to the desired metallization pattern. After the resist has been developed, the structure is etched. A solution comprising 600 grams nitric acid, 600 grams sulfuric acid and 600 grams of $H_3PO_4$ in 1.5 liters of water is usable for this purpose. This etchant attacks copper but leaves barrier metals untouched. It also does not affect chip metallization. After the copper has been suitably etched, the titanium, for example, is etched using a solution of fluoroboric acid. Alternatively, the titanium layer is etched using reactive ion etching in a $CF_4$ plasma.

Using plasma to remove the barrier metals is attractive because it prevents the polymer from being directly exposed at any time in the process to wet processing steps which might cause the polymer to absorb small amounts of the wet processing material which could later attack the chip surface. An alternative to the contact mask method of exposing the photoresist is to use a laser which is scanned under control of a computer according to the method disclosed in application Ser. No. 947,461, filed Dec. 29, 1986 and assigned to the instant assignee.

It is worthwhile to point out the salient features of the structure thus far obtained. First, the metallization is patterned to form very fine lines and spaces, typically under 1 mil in line width and 1 mil in line spacing. Tests performed using an adaptive lithography system, have demonstrated 6 micron lines and spaces the present invention. In addition, it can be seem from FIG. 1, that chips can now essentially be placed edge to edge. Chips are easily interconnected because the metallization pitch (1-mil lines and space) is much finer than the pad spacing (typically 10 mil) associated with the chips themselves. The resulting structure is one in which the interconnect length is as short as possible, and in which the width of the conductors is from about 6 to about 25 microns. In addition, the dielectric is typically 1 mil thick with a dielectric constant midway between the relative dielectric constants of ULTEM ® resin and KAPTON ® films, or approximately 3.2. This results in a very low capacitance loading system. It should also be noted that the interconnect length and capacitive loading of the present system is substantially lower than is achieved in any other approach. It should also be noted that with chips placed edge to edge, a minimum ratio between the overall package size and the area of silicon involved is achieved. Also, note that there is only one interconnect run and two interconnects required to connect from one chip to another and, additionally, the interconnect run is an integral part of the interconnect. No known art provides for fewer interconnects or for an interconnect run to be an integral part of the interconnect. Further, the interconnect and the interconnect run is preferably formed by vacuum sputter methods such that the surface receiving metallization pattern is cleaned by sputtering, followed by immediate metallization. This method results in highly reliable interconnections with very low contamination levels. This method is superior to those methods utilizing soldering which can involve contamination from flux and from oxidation due to heating of the system in an air environment.

Figure 2:
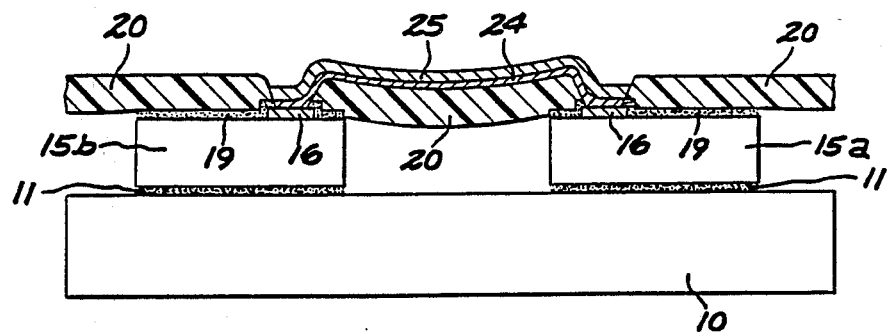
FIG. 2 is a cross-sectional side elevation view illustrating an interchip connection in accordance with the present invention.

FIG. 2 shows a cross-section of a resulting high density interconnection structure in accordance with the present invention. As can be seen in the figure, there is a bridge comprising flexible polymer material 20 and a layer of thin metallization between two interconnected chips. Polymer layer 20 and metallization patterns 25 are also seen in a broader perspective view in FIG. 1. The layer of metallization includes copper metallization 25, as described above, and also preferably includes optional titanium barrier layer 24. Adhesive material 11, as described above, serves to affix integrated circuit chips 15a and 15b to substrate 10. Similarly, adhesive 19 is preferably employed to affix polymer layer 20 to the substrate/chip structure. It is, however, noted that adhesive layer 19 is generally optional and is not necessarily included in every fabrication methods. In the event of a thermal mismatch between any of the components of the system, the relatively flexible polymer is stretched or compressed as necessary to to accommodate the differential movement. Metallization 25 preferably including copper also accommodates differential expansion with essentially no stress applied to the interconnect area. Thermally induced stress is a significant problem in other known structures such as the solder bump structure and in chip carrier structures where the package containing the chip is soldered, without leads, to a non-thermally matched circuit board.

It can also be seen in the cross-section of FIG. 2 that the interconnect area required by the process of the present invention is only limited by the size of the via hole and the ability to pattern the metallization layer. In this process, via holes of 6 microns have been achieved using maskless via hole processes as described in aforementioned U.S. Pat. No. 4,714,516. Metallization patterning in the 6 to 25 micron region has also been achieved. Therefore, a 6 to 25 micron diameter region is all the area required for an interconnection. This has profound implications on the area required for interconnection pads positioned on a chip for the purpose of making connections. It can also be seen from FIG. 1 that it is not necessary that the chip pads be confined to the periphery of the chip. This again, has architectural implications since interconnections can be made at any convenient point on the chip without having to use additional space to reach the periphery of the chip. Finally, the reduced capacitance associated with the interconnect results in reduced requirements for high-powered drivers. This, coupled with the ability to make far more interconnections to a particular chip due to smaller pad size, results in new architectural options which optimize the size of the chip according to the yield presently being achieved with a particular process. Partitioning limitations have often forced chips to be larger than desired from the viewpoint of increasing the chip yield.

Figure 3A:
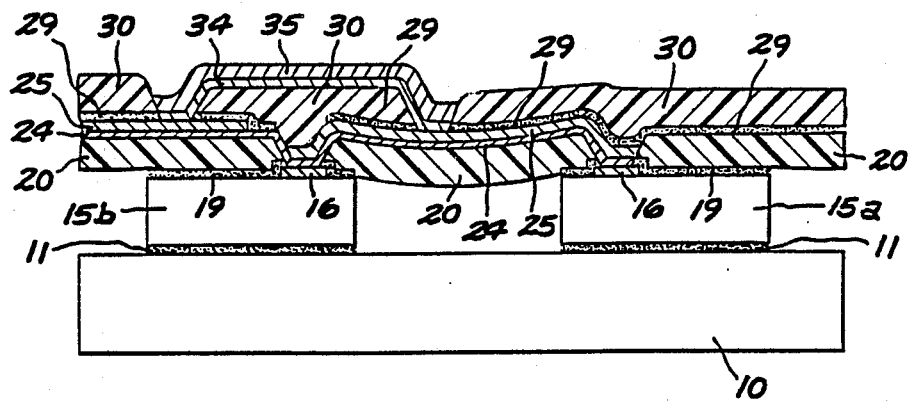
FIG. 3A is a view similar to FIG. 2 which more particularly illustrates the utilization of multiple overlay films for more complicated and nonplanar interconnection arrangements.

It should also be noted that the invention disclosed is not limited to a single layer of metallization. For example, in an exemplary embodiment, an additional dielectric metallization layer is applied by any of a number of means. First, a second dielectric layer is applied. The dielectric layer can be applied by spraying an adhesive, as described above, which comprises ULTEM ® resin in a solvent of methylene chloride and acectophenone. After subsequent drying, a second layer comprising KAPTON ® film is laminated over the existing structure. Via holes are then fabricated either by metal mask and etching or by maskless via hole information using a laser as described in U.S. Pat. No. 4,714,516. Metallization is applied by sputtering, as above. Metallization is patterned by applying photoresist and patterning in the conventional manner or by using the adaptive lithography laser system described above. FIG. 3A shows a cross-section of the resulting structure. In particular, attention is directed to second adhesive layer 29, second polymer layer 30 and second metallization layer which includes second titanium barrier layer 34 together with interconnect conductor 35, preferably comprising copper, as above.

Figure 3B:
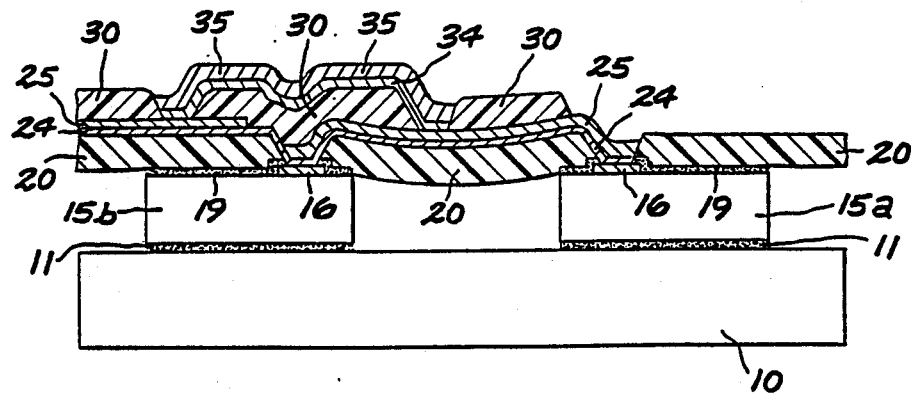
FIG. 3B is a figure similar to FIG. 3A which more particularly illustrates the utilization of a laminated film layer together with a second applied polymer layer.

In a similar fashion, FIG. 3B shows a multilayer system, in cross-sectional view, in which the second dielectric layer comprises an ULTEM ® resin or other polymer dielectric which is sprayed over the first layer. In this case, the same mixture which is used for the adhesive layer as described above, is used as the dielectric layer. A first layer is sprayed and dried at a temperature of between approximately 250° C. and approximately 350° C. for a period of about 5 minutes. After cooling, a second layer is sprayed and dried as before. Finally a third layer is sprayed and dried. This results in a layer approximately 12 microns thick. Via holes and metallization are fabricated as described above. A third alternative is to use paraxylene as the dielectric. The deposition of this material involves heating the substrate in a vacuum of approximately 1 torr and admitting the paraxylene monomer in a controlled manner such that a polymer is formed on all exposed surfaces of the substrate. Such chemical vapor deposition is characterized by a very even coating which is free of pinholes. Via holes and metallization are then formed as described above.

In a preferred embodiment of the present invention, polymer layer 20 is typically approximately 12 to 25 microns thick. Each of the adhesive layers 19 and 29 are typically approximately 3 microns thick. The second polymer layer is typically 12 microns thick particularly in the event that it is an applied, as opposed to a laminated film layer. Titanium barriers 24 and 34 are each typically approximately 0.1 to 0.2 microns thick. Likewise, each of the copper metallization layers 25 and 35 are typically approximately 3 to 6 microns thick. The copper may be deposited by sputtering or vacuum deposition. However, neither of these methods is presently preferred over the other.

A very important aspect of the present invention is now described. In particular, one of the significant advantages of the present invention is that overlay layer 20 (and its associated metallization patterns) may be removed. For example, removal of layers may be effected in a batch process which comprises alternately etching or dissolving metallization layer, followed by etching or dissolving a polymer layer. This process is continued until the only remaining layers are the polymer film and metallization layers which were first applied. At this point, copper metallization is removed by dissolving it in a bath of nitric acid, sulfuric acid and $H_3PO_4$ as described above. Since titanium is unattacked by this etchant, it remains. When substantially all of the copper has been removed, the titanium is removed by dipping the structure in a solution of fluoroboric acid or alternatively, in a presently preferred embodiment, by reactive ion etching in an atmosphere of gaseous $CF_4$.

Since the titanium layer is relatively thin (approximately 1,000 angstroms), it is quickly removed by the plasma. Plasma devices operating at an RF input of 150 watts for period of approximately 5 minutes are used to achieve the desired result. Any exposed pads on the chip and on the packing layer are beneficially cleaned by the plasma. At this point, the plasma gas can be changed to an oxygen plasma enhanced by CF4. This quickly etches KAPTON ® film material and ULTEM ® resin based polymer composites leaving behind only bare, clean chips ready for reprocessing. In an alternative embodiment, the substrate is soaked in methylene chloride for 2 hours which lifts off KAPTON ® film material. Individual chip components are now removed by heating the substrate to the softening point of the particular die attachment method. Typically, this is the melting point of the solder if eutectic die attachment was used, or the deflection point (or above) of the epoxy if an epoxy die attachment is used, or the melting point of the thermoplastic, if a thermoplastic die attachment method is used. A new chip is then used to replace any bad chips and the process can be repeated.

The ability to remove the overlay layer is very significant. It permits the fabrication of multichip integrated circuit packages in which the chips are first arranged in a test configuration. This is highly significant for purposes of testability. As chip systems become more and more complicated, both in their own circuitry and in their interconnections and interactions, testing of the resulting chips and systems becomes more and more difficult. The level of difficulty for chip testing can in fact be seen to grow at a rate greater than exponential growth because of the combinatorically greater complexity. However, the removability of the overlay layer together with the ability to apply a new layer and to connect the chips in a different pattern and to remove defective chips, effectively achieves wafer scale integration, without sacrificing in any way testability constraints.

It should also be noted that while the foregoing discussion is generally directed to a package employing a plurality of chips, the system and method of the present invention is also applicable to the situation in which only a single chip is present. In this instance, the polymer film (or multilevel films) provide a removable insulative structure in which vias are provided and on which metallization patterns are disposed for the purpose of intrachip connection and/or for the purpose of connecting select chip pads to exterior pins or pads disposed on the substrate to which the chip is affixed.

From the above, it should be appreciated that the packaging configuration and method of the present invention significantly advances the semiconductor packaging arts. It should also be noted that the method of the present invention can be used to interconnect multiple packages in accordance with the present invention, that is, a second or third overlay layer may be employed to connect sets of multichip packages, each of which is fabricated in accordance with the present invention. It is further seen that the configuration and methods described herein are economic and readily achieved without fabrication complexity. It is also seen that the processing methods described herein provide significant advantages with respect to the physical and electrical characteristics of the resulting circuit packages. It is also further seen that the system of the present invention fully satisfies all of the aforementioned objects.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for packaging integrated circuit chips, said method comprising the steps of:
   disposing a plurality of integrated chips on a substrate, said chips including interconnection pads;
   applying a polymer film layer over said chips and said substrate so that said film bridges said chips in a manner to leave vacant space between said film and said substrate;
   providing a plurality of via openings in said polymer film, said openings being disposed over at least some of said interconnecting pads; and
   providing a pattern of electrical conductors on said film so said conductors extend between said via openings so as to electrically connect selected interconnection pads.

2. The method of claim 1 in which said substrate comprises material selected from the group consisting of glass, metal, ceramic, plastic, silicon and composites.

3. The method of claim 1 in which said polymer film comprises material selected from the group consisting of thermoplastics and thermoset materials.

4. The method of claim 1 further including the steps of removing said pattern of electrical conductors and said polymer film and reapplying a second polymer film and a second pattern of electrical conductors.

5. The method of claim 1 wherein said polymer film layer comprises a removable layer.

* * * * *